United States Patent
Boyington et al.

(10) Patent No.: US 6,175,812 B1
(45) Date of Patent: Jan. 16, 2001

(54) METHOD AND SYSTEM FOR DYNAMIC DURATION BURN-IN

(75) Inventors: Rick Boyington; Denzil Rogers, both of Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/031,411

(22) Filed: Feb. 26, 1998

(51) Int. Cl.[7] ................................................. G06F 19/00
(52) U.S. Cl. ................................ 702/118; 324/760
(58) Field of Search ................................. 324/527, 528, 324/760; 702/118, 81, 87; 716/4

(56) References Cited

U.S. PATENT DOCUMENTS

| | | | |
|---|---|---|---|
| 4,660,282 | 4/1987 | Pfaff | 29/829 |
| 4,926,117 | 5/1990 | Nevill | 324/158 F |
| 5,180,974 | 1/1993 | Mitchell et al. | 324/158 |
| 5,267,395 | 12/1993 | Jones, Jr. et al. | 29/829 |
| 5,279,975 | 1/1994 | Devereaux et al. | 437/8 |
| 5,315,598 | 5/1994 | Tran | 371/21.1 |
| 5,440,241 | 8/1995 | King et al. | 324/765 |
| 5,461,328 | 10/1995 | Devereaux et al. | 324/765 |
| 5,534,786 | 7/1996 | Kaneko et al. | 324/760 |
| 5,539,324 | 7/1996 | Wood et al. | 324/758 |
| 5,541,524 | 7/1996 | Tuckerman et al. | 324/754 |
| 5,557,559 * | 9/1996 | Rhodes | 364/580 |
| 5,559,444 | 9/1996 | Farnworth et al. | 324/754 |
| 5,570,032 | 10/1996 | Atkins et al. | 324/760 |
| 5,578,934 | 11/1996 | Wood et al. | 324/758 |
| 5,642,073 | 6/1997 | Manning | 327/536 |
| 5,726,920 * | 3/1998 | Chen et al. | 364/579 |
| 5,761,064 * | 6/1998 | La et al. | 364/468.17 |
| 5,787,021 * | 7/1998 | Samaha | 364/552 |
| 5,831,445 * | 11/1998 | Atkins et al. | 324/760 |
| 5,907,492 * | 5/1999 | Akram et al. | 364/468.28 |
| 5,935,264 * | 8/1999 | Nevill et al. | 714/724 |
| 5,940,300 * | 8/1999 | Ozaki | 364/468.28 |

* cited by examiner

Primary Examiner—Patrick Assouad
(74) Attorney, Agent, or Firm—Schwegman, Lundberg, Woessner & Kluth, P. A.

(57) ABSTRACT

A computer-implemented method and system for dynamic duration burn-in. A computer system is provided having a processing unit, input device and storage. The storage includes a performance database for tracking burn-in test results of a plurality of ICs. Test criteria is determined against which the burn-in test results will be compared. The plurality of ICs are stressed for a burn-in interval in a stress chamber and the plurality of ICs are tested to determine a failure rate from burn-in. The failure rate is compared to the test criteria and the steps of stressing, testing and comparing are repeated until the failure rate fulfills the test criteria.

33 Claims, 4 Drawing Sheets

METHOD AND SYSTEM FOR DYNAMIC DURATION BURN-IN

FIELD OF THE INVENTION

The present invention relates to integrated circuit testing, and in particular, to the efficient burn-in testing of integrated circuits.

BACKGROUND OF THE INVENTION

Photo-printing and etching are two methods used to fabricate integrated circuits (IC's). Such IC's can be SRAMs, DRAMs or other types of memory units. In photolithography, hundreds of dice are manufactured from a single wafer. After the dice are formed on the wafer, the wafer is segmented into individual units and encapsulated to form a set of packaged ICs.

Unfortunately, a percentage of the IC parts are defective. Some of these parts have defects from the manufacturing process. Others will malfunction within a short period of use. These imperfect ICs which malfunction after a short period of use are the "infant mortalities." Within a mature product line, a relatively small percentage of failures will be infant mortalities. However, for a newer, immature product line, the percentage of failures could be significant. It is important to isolate these infant mortalities so that they can be discarded prior to sale, because the presence of devices destined to become infant mortalities decreases the overall reliability of the IC population. To weed out the infant mortalities, a type of stress testing, called burn-in, is used.

In the burn-in test process, ICs are subjected to a high level of stressful conditions, including high temperatures and high voltage. During a typical burn-in test, thousands of ICs are inserted in burn-in boards, which allow electrical connectivity to the individual ICs. These burn-in boards are then placed in ovens, which raise the operating temperature of the ICs. The batch of ICs in the oven are stressed for a long period of time and then tested. For example, the temperature in the burn-in ovens may be raised to 125° Celsius, whereby the part's operating temperature specification may be no more than 70° Celsius. As additional stress, 7 volts may be applied to the ICs rather than the standard 5 volts.

Traditionally, after an extended period of time, perhaps 24 or more hours, the ICs are removed from the oven and are tested to determine if hard fail mechanisms were present. These are the infant mortalities. Although it is very important to find the infant mortalities in a batch of ICs, burn-in testing is time consuming and costly. The burn-in testing equipment requires a large facility in order to test a large number of ICs. The stressful conditions—heat and electricity—require a substantial amount of power, thus requiring an enormous capital outlay. Testing each IC for such an extended period of time also increases production cycle time.

This traditional type of burn-in testing can be referred to as "Blind Burn-In." In Blind Burn-In, all of the ICs loaded in the burn-in ovens are subjected to the stressful conditions for the same predetermined length of time. The length of time in the ovens must be long enough so that the infant mortalities can be identified. For those ICs which are not infant mortalities, time spent in the ovens is essentially wasted. And for those infant mortalities themselves, the time spent in the ovens past their failure point is also wasted overhead. Unfortunately, in Blind Burn-In, it is not possible to determine the exact point the infant mortalities occurred. So, to ensure that all infant mortalities are detected, the burn-in time must be extended.

A second type of burn-in testing can be called "Monitored Burn-In." In a Monitored Burn-In arrangement, the ICs are stressed and then tested at regular intervals. After burn-in is completed for a batch of IC parts, the data acquired at each interval is analyzed. Using this data, testing engineers can determine the length of time sufficient in that particular batch of ICs to weed out the infant mortalities. However, since each batch of ICs may be from more or less mature product lines, or since each batch of ICs contain parts fabricated from different machines, having different successful yield rates, the data acquired during Monitored Burn-In testing is not highly useful for subsequent batches of ICs. Because of this, many parts must endure unnecessary lengths of burn-in duration.

What is needed is a method for acquiring test data in real-time and using that data to optimize the burn-in testing process. The method should allow test engineers to be able to burn-in and test a batch of IC parts only for that length of time for which the infant mortalities are detected. A method such as this could significantly cut burn-in test cycle time as well as save both labor and equipment costs. Use of this method would also increase yields and reduce the need for retesting, since ICs would only be subjected to the amount of highly stressful conditions necessary for the detection of infant mortalities. This method would also provide more immediate feedback to previous manufacturing entities.

SUMMARY OF THE INVENTION

A computer-implemented method and system for dynamic duration burn-in. A computer system is provided having a processing unit, input device and storage. The storage includes a performance database for tracking burn-in test results of a plurality of ICs. Test criteria is determined against which the burn-in test results will be compared. The plurality of ICs are stressed for a burn-in interval. The plurality of ICs are tested to determine a failure rate from burn-in. The failure rate is compared to the test criteria. The steps of stressing, testing and comparing are repeated until the failure rate fulfills the test criteria.

BRIEF DESCRIPTION OF THE DRAWINGS

FIG. 2 is a flowchart of the method of dynamic duration burn-in.

FIG. 4 is a block diagram of a computer system which performs dynamic duration burn-in.

DETAILED DESCRIPTION

In the following Detailed Description, reference is made to the accompanying drawings which form a part hereof and in which is shown by way of illustration specific embodiments in which the invention may be practiced. These embodiments are described in sufficient detail to enable those skilled in the art of software programming and IC test engineering to practice and to use the invention, and it is to be understood that other embodiments may be utilized and that changes may be made without departing from the spirit and scope of the present invention. The following Detailed Description is, therefore, not to be taken in a limiting sense and the scope of the invention is defined by the appended claims. In the figures, elements having the same number perform essentially the same functions.

Figure 1:
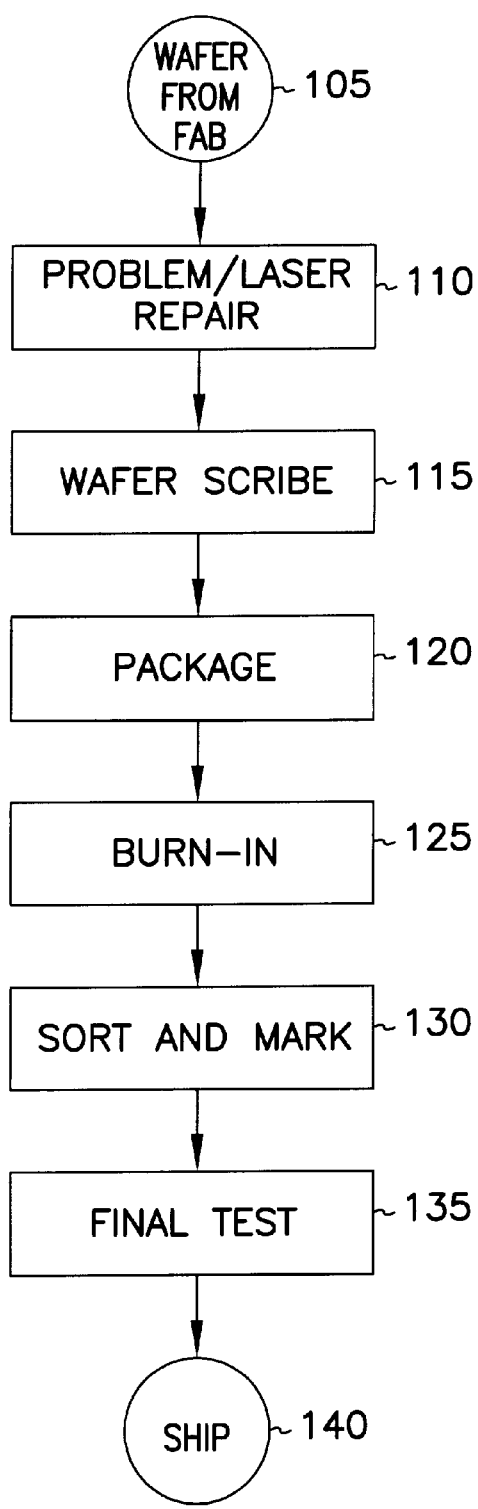
FIG. 1 is a flowchart of the production of ICs from wafers.

Referring to FIG. 1, the phases of integrated circuit manufacturing, from the prior art, is shown as a flow chart.

Wafers, each having hundreds of dice, are fabricated using photolithography, an etching process, or other technique 105. The wafer is tested in probe 110 by testing selected regions of the circuits. Then the wafer can be scribed—segmented—into its individual parts 115 and packaged into integrated circuits 120. The burn-in process 125 stresses and tests the ICs to detect the infant mortalities. The ICs are marked according to their quality and function 130 and withstand a final set of tests 135 prior to shipment 140.

The present invention is a method and system for Dynamic Duration Burn-In, which is implemented as step 125 of the integrated circuit manufacturing process charted in FIG. 1. In general, the method starts with determining a core time. From historical data of similar ICs, a core time is calculated, which is the time of stress that is to be applied to all ICs in the batch. During the core time, intermittent read points, designed to identify malfunctioning ICs, are set up. At each read point, performance data is collected from the ICs and a curve of failed ICs is generated. After the core stress is completed, calculations are made from the performance data and a determination is made as to whether the batch has reached an acceptable performance rate or whether the batch needs to continue burn-in.

Figure 2:
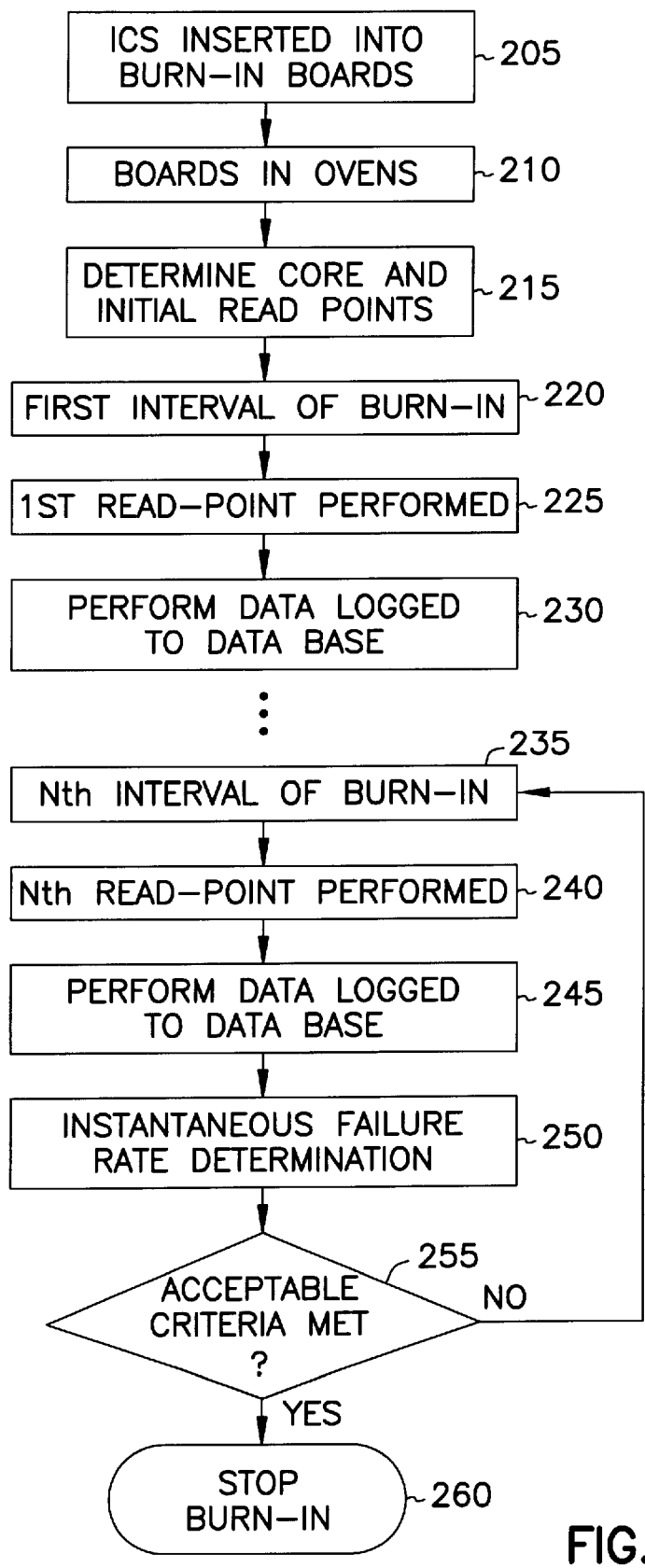

The method of dynamic duration burn-in is shown by FIG. 2. In FIG. 2, thousands of ICs that have been packaged at step 120 are installed in a set of burn-in boards 205. The boards are then inserted into the burn-in ovens 210 so that the operating temperatures and voltages can be increased to a stressful level. The intervals and length of core burn-in test have already been calculated 215 and then the burn-in proceeds to the first burn-in interval and subsequent read-point of the core period 220. At this point, the first set of performance data of the burn-in test results is read from the ICs 225 and is written to a performance database 230. The performance database 230 may contain such information as: the delta and hazard values for each lot at each read-point, the delta and hazard pass/fail status, the core period (i.e., the minimum burn-in time), the burn-in intervals (i.e., periods of time between read-points), the actual passing read-point, the actual infant mortality fails, the actual latent mortality fails, and the predicted passing read-point. After the performance data is written to the performance database 230, then the cycle of intermediate burn-in times 235, read points 240 and database maintenance 245 is governed by the calculation of the failure rate 250, which is compared to a set of acceptable test criteria 255. Once the acceptable test criteria is met 255, the burn-in stress test terminates 260.

In the dynamic burn-in method shown in FIG. 2, any number of read points 240 can be made. For example, the core burn-in time may be 24 hours with hourly read points 240. Or, the read points 240 can be adjusted throughout the burn-in test cycle so as the cycle nears completion, the read points are placed at shorter intervals.

Figure 3:
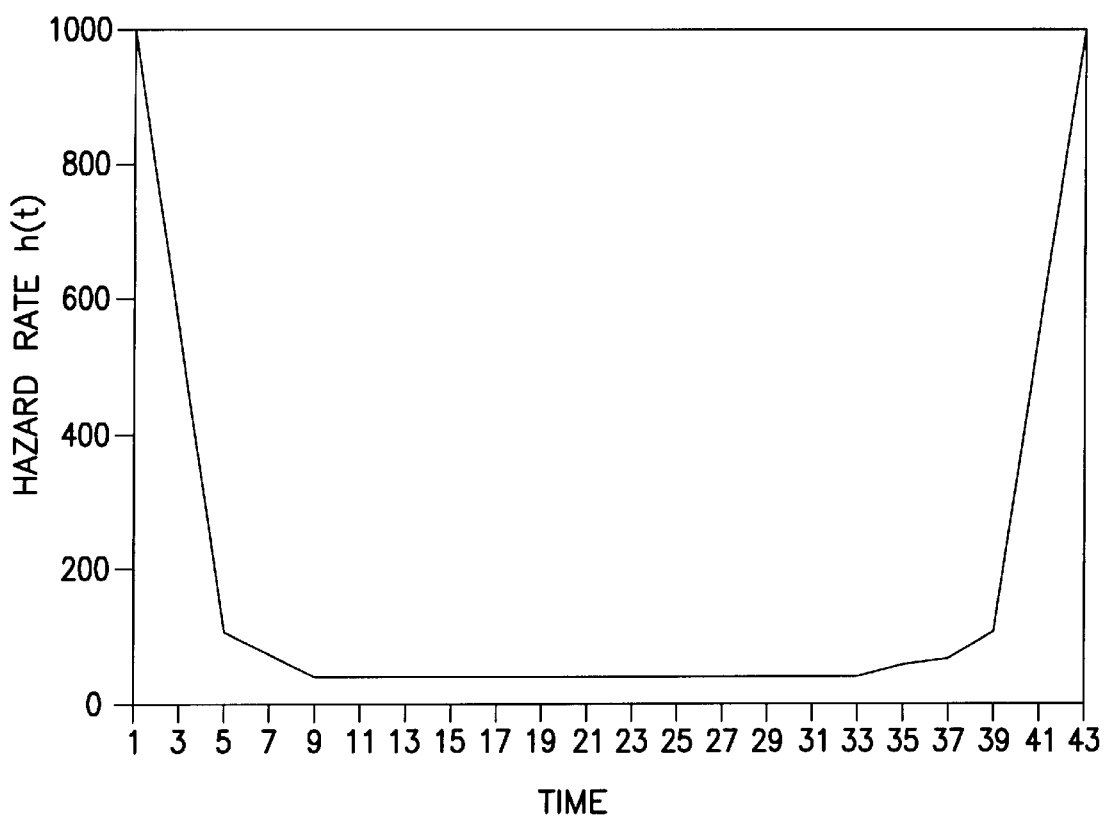
FIG. 3 is a "bathtub" curve representing the results from a burn-in test.

The failure rate calculation 250 can include the determination of the instantaneous rate of failure, in other words, the point on the failure slope at which the calculation is made. Using this rate, when the slope slows to a certain level, the computer can assess that the infant mortalities have been identified and the remaining ICs will need no additional burn-in. For example, FIG. 3, shows the resulting "bathtub" curve resulting from a typical burn-in test. The "hazard rate" of the y-axis is the number of failed ICs. Thus, the points charted on the curve represent the instantaneous failure rate at those particular times.

The infant mortalities shown in FIG. 3 are those ICs which fail up through about time=5. The rest of the curve shows that the useful life of the healthy ICs extends to about time=39, after which the ICs quickly wear out. By calculating the slope of this line as the burn-in progresses, burn-in can be terminated once the curve flattens to a random failure rate. Thus, at some point between time=6 and time=11, depending on the parameters set as acceptable criteria, the usefulness of the burn-in test is maximized. The acceptable criteria checked during burn-in 255 are dependent on the goals of the burn-in testing. If the product line is mature, and the resulting bathtub curve typical to that product line, then burn-in may be terminated rather early, such as at time=5. On the other hand, for immature products, whose bathtub curves vary widely, burn-in might be extended to time=11. To enable these goals, the acceptable criteria might be met when the slope of the charted line is flat (zero). Or, the acceptable criteria might be met when the slope of the charted line has been flat for a given amount of time.

The failure rate calculation 250 can also consider statistical analysis of past performance data, extracted from the performance database. Such analysis of the database enables the burn-in testing to be dynamically fine-tuned as the database grows. This process would allow the burn-in cycle to become more reliable through time.

Figure 4:
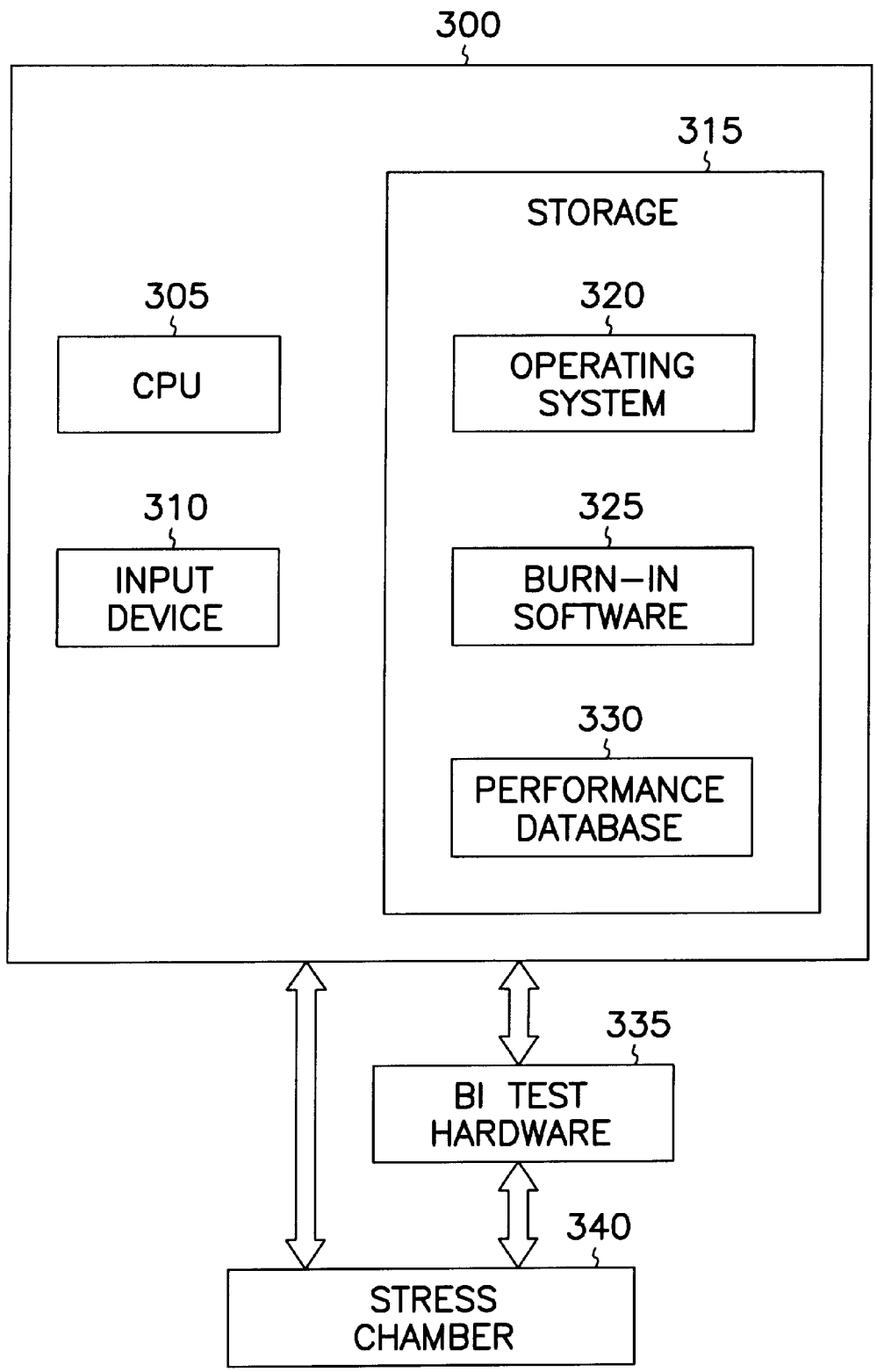

FIG. 4 is a block diagram of a computer system which interfaces with Burn-in Test Hardware 335 which performs dynamic duration burn-in a test chamber 340. Input devices 310 can include a keyboard or touch-screen which initiate test program in storage 315 and interfaces with Burn-in Test Hardware. Computer system 300 also has storage 315 which includes operating system 320, burn-in software 325 and database 330. Burn-in software 325 implements much of the method shown in FIG. 2 by interfacing with burn-in test hardware 335 and logs performance data to the performance data base 330. The failure data from a read-point is used to calculate the instantaneous failure rate and delta of these failure rates between read-points. This information is compared with established criteria in the performance data base 330 and is analyzed by burn-in software 325 to dynamically control the duration of burn-in.

Other embodiments of the dynamic burn-in method and system are possible without departing from the scope and spirit of the present invention. Other embodiments of this invention include a configuration which would speed up the period between read points as the batch progresses closer to terminating.

Although specific embodiments have been illustrated and described herein, it will be appreciated by those of ordinary skill in the art of programming and IC test engineering, that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

We claim:

1. A computer-implemented method for dynamic duration burn-in of integrated circuits (IC's), comprising:

providing a computer system having a processing unit, input device and storage, wherein the storage includes a performance database for tracking burn-in test results of a plurality of ICs;

determining test criteria against which the burn-in test results will be compared;

stressing the plurality of ICs for a burn-in interval;

testing the plurality of ICs to determine an instantaneous failure rate from burn-in;

comparing the instantaneous failure rate to the test criteria;

repeating the stressing, testing and comparing until the instantaneous failure rate fulfills the test criteria and dynamically stopping the burn-in interval in response thereto.

2. The method according to claim 1, wherein testing further comprises receiving performance data concerning the plurality of ICs for indicating which of the ICs have malfunctioned.

3. The method according to claim 1, wherein testing further comprises writing the performance data to the performance database.

4. The method according to claim 1, wherein testing further comprises calculating a failure rate of the plurality of ICs as a function of the performance data.

5. The method according to claim 1, wherein stressing further comprises adjusting the burn-in interval as a function of the failure rate.

6. The method according to claim 1, wherein stressing further comprises adjusting the burn-in interval as a function of the performance database.

7. The method according to claim 1, wherein stressing further. comprises setting a burn-in interval initially to a core time.

8. A computer program product, comprising:
a computer usable medium having computer readable program code embodied thereon, the computer readable program code, when executed, implementing on the computer a method for dynamic duration burn-in, the method comprising:
determining test criteria against which the burn-in test results will be compared;
stressing the plurality of ICs for a burn-in interval;
testing the plurality of ICs to determine instantaneous failure rate from burn-in;
comparing the failure rate to the test criteria;
repeating the stressing, testing and comparing until the instantaneous failure rate fulfills the test criteria and prematurely terminating the burn-in interval in response thereto.

9. The computer program product according to claim 8, wherein testing further comprises receiving performance data concerning the plurality of ICs for indicating which of the ICs have malfunctioned.

10. The computer program product according to claim 8, wherein testing further comprises writing the performance data to the performance database.

11. The computer program product according to claim 8, wherein testing further comprises calculating a failure rate of the plurality of ICs as a function of the performance data.

12. The computer program product according to claim 8, wherein stressing further comprises adjusting the burn-in interval as a function of the failure rate.

13. The computer program product according to claim 8, wherein stressing further comprises adjusting the burn-in interval as a function of the performance database.

14. The computer program product according to claim 8, wherein stressing further comprises setting a burn-in interval initially to a core time.

15. A dynamic duration burn-in device, comprising:
a computer system having a processing unit, input device and storage, wherein the storage further includes a performance database for tracking burn-in test results of a plurality of ICs and test criteria against which the burn-in test results will be compared;
a stress chamber connected to the computer system and operable for stressing the plurality of ICs for a burn-in interval;
a burn-in test hardware connected to the computer and operable for testing the plurality of ICs to determine a failure rate from burn-in; and
the computer system operable for comparing the failure rate to the test criteria, and for repeating the stressing, testing and comparing until the failure rate fulfills the test criteria.

16. The device according to claim 15, wherein the burn-in test hardware receives performance data concerning the plurality of ICs for indicating which of the ICs have malfunctioned.

17. The device according to claim 16, wherein the burn-in test hardware sends the performance data to the computer systems which writes the performance data to the performance database.

18. The device according to claim 15, wherein the computer system calculates a failure rate of the plurality of ICs as a function of the performance data.

19. The device according to claim 15, wherein the computer system controls the stress chamber to adjust the burn-in interval as a function of the failure rate.

20. The device according to claim 15, wherein the computer system controls the stress chamber to adjust the burn-in interval as a function of the performance database.

21. The device according to claim 15, wherein the computer system controls the stress chamber to set a burn-in interval initially to a core time.

22. A dynamic duration burn-in device, comprising:
a controllable stress chamber;
a burn-in test hardware;
a computer system having a processing unit, input device and storage, and connected to the controllable stress chamber and the burn-in test hardware, the computer system programmed to execute the following:
providing a performance database for tracking burn-in test results of a plurality of ICs;
determining test criteria against which the burn-in test results will be compared;
stressing the plurality of ICs for a burn-in interval;
testing the plurality of ICs to determine instantaneous failure rate from burn-in;
comparing the instantaneous failure rate to the test criteria; and
repeating the stressing, testing and comparing until the failure rate fulfills the test criteria and stopping the burn-in before the end of the burn-in interval.

23. The dynamic duration burn-in device according to claim 22, wherein testing further comprises receiving performance data concerning the plurality of ICs and indicating which of the ICs have malfunctioned.

24. The dynamic duration burn-in device according to claim 22, wherein testing further comprises writing the performance data to the performance database.

25. The dynamic duration burn-in device according to claim 22, wherein testing further comprises calculating a failure rate of the plurality of ICs as a function of the performance data.

26. The dynamic duration burn-in device according to claim 22, wherein stressing further comprises dynamically adjusting the burn-in interval as a function of the failure rate.

27. The dynamic duration burn-in device according to claim 22, wherein stressing further comprises dynamically adjusting the burn-in interval as a function of the performance database.

28. The dynamic duration burn-in device according to claim 22, wherein stressing further comprises setting a burn-in interval initially to a core time.

29. A computer-implemented method for dynamic duration burn-in of integrated circuit, comprising:

defining a burn-in interval for the integrated circuits stressing the integrated circuits in a stress chamber;

periodically testing the integrated circuits to determine an instantaneous failure rate; and stopping the stressing when the instantaneous failure rate is equal to approximately a random failure rate.

30. A method for dynamic duration burn-in of integrated circuits, comprising:

providing a computer system having a processing unit, input device and storage, providing a stress chamber;

placing a plurality of integrated circuits in the stress chamber;

simultaneously stressing and testing the integrated circuits to measure an instantaneous failure rate, and stopping the stressing and testing when the instantaneous failure rate at or below a predefined failure rate.

31. A dynamic duration stress testing device, comprising:

a computer system having a processing unit, input device and memory;

a performance database residing in the memory for tracking stress test results of a plurality of integrated circuits and test criteria against which the stress test results will be compared;

a stress chamber connected to the computer system and operable for stressing the plurality of integrated circuits for a dynamic stress time interval;

a test device connected to the computer and operable for periodically testing the plurality of integrated circuits to determine an instantaneous failure rate; and the computer system operable for comparing the instantaneous failure rate to the test criteria, and for repeating the stressing, testing and comparing until the failure rate drops to a rate approximately equivalent to a random failure rate.

32. The device according to claim 31, wherein the stress device dynamically adjusts the stress test time interval as a function of the failure rate.

33. The device according to claim 31, wherein the random failure rate is measured as a zero slope portion of a curve plotting hazard rate to time.

\* \* \* \* \*